(12) United States Patent
Sandoz et al.

(10) Patent No.: US 7,977,122 B2
(45) Date of Patent: Jul. 12, 2011

(54) FLUIDIC DEVICE CONTAINING 3D STRUCTURES

(75) Inventors: Roger Sandoz, Rotkreuz (CH); Carlo Effenhauser, Weinheim (DE)

(73) Assignee: Roche Diagnostics Operations, Inc., Indianapolis, IN (US)

( * ) Notice: Subject to any disclaimer, the term of this patent is extended or adjusted under 35 U.S.C. 154(b) by 746 days.

(21) Appl. No.: 11/669,351

(22) Filed: Jan. 31, 2007

(65) Prior Publication Data

US 2007/0184672 A1   Aug. 9, 2007

(30) Foreign Application Priority Data

Feb. 9, 2006   (EP) ..................................... 06002630

(51) Int. Cl.
*H01L 21/00* (2006.01)
*B27N 3/18* (2006.01)
*G02B 5/18* (2006.01)
*C12N 11/08* (2006.01)

(52) U.S. Cl. ............. 438/6; 264/319; 435/180; 359/576

(58) Field of Classification Search ...... 438/6; 359/576; 264/319; 435/180; 235/200
See application file for complete search history.

(56) References Cited

U.S. PATENT DOCUMENTS

| 4,272,473 | A  | * | 6/1981 | Riemersma et al. .......... 264/154 |
| 5,234,813 | A  |   | 8/1993 | McGeehan et al. |
| 5,269,983 | A  | * | 12/1993 | Schulz .......................... 264/154 |
| 6,348,999 | B1 | * | 2/2002 | Summersgill et al. ........ 359/569 |
| 6,686,184 | B1 | * | 2/2004 | Anderson et al. ............. 435/174 |
| 6,827,906 | B1 |   | 12/2004 | Bjornson et al. |
| 7,010,199 | B2 | * | 3/2006 | Kim et al. ........................ 385/49 |
| 7,354,072 | B2 | * | 4/2008 | Yokote et al. ................... 283/92 |
| 2003/0096081 | A1 | * | 5/2003 | Lavallee et al. ............... 428/138 |
| 2003/0156992 | A1 | * | 8/2003 | Anderson et al. ............. 422/100 |
| 2005/0042766 | A1 | * | 2/2005 | Ohman et al. ................. 436/174 |
| 2006/0108905 | A1 | * | 5/2006 | Cho et al. ....................... 313/292 |
| 2006/0196327 | A1 | * | 9/2006 | Larsen ............................... 83/13 |
| 2008/0178987 | A1 | * | 7/2008 | Zhou et al. ................... 156/73.1 |

FOREIGN PATENT DOCUMENTS

| EP | 1 120 164 A2 | 8/2001 |
| EP | 1 542 010 A1 | 6/2005 |
| JP | 07-286258 | 10/1995 |
| JP | 2004261911 A | 9/2004 |
| WO | WO 99/19717 | 4/1999 |
| WO | WO 01/25137 A1 | 4/2001 |

\* cited by examiner

*Primary Examiner* — Walter L Lindsay, Jr.
*Assistant Examiner* — Ron Pompey
(74) *Attorney, Agent, or Firm* — Dinsmore & Shohl, LLP

(57) ABSTRACT

A micro fluidic device comprises a laminate structure, comprising a plurality of individual layers. At least one layer comprises a micro fluidic channel structure and at least on one side of said layer a further layer is arranged comprising a three-dimensional (3D) micro structure such that the 3D micro structure is influencing a flow characteristic of a fluid within the micro fluidic channel structure.

8 Claims, 7 Drawing Sheets

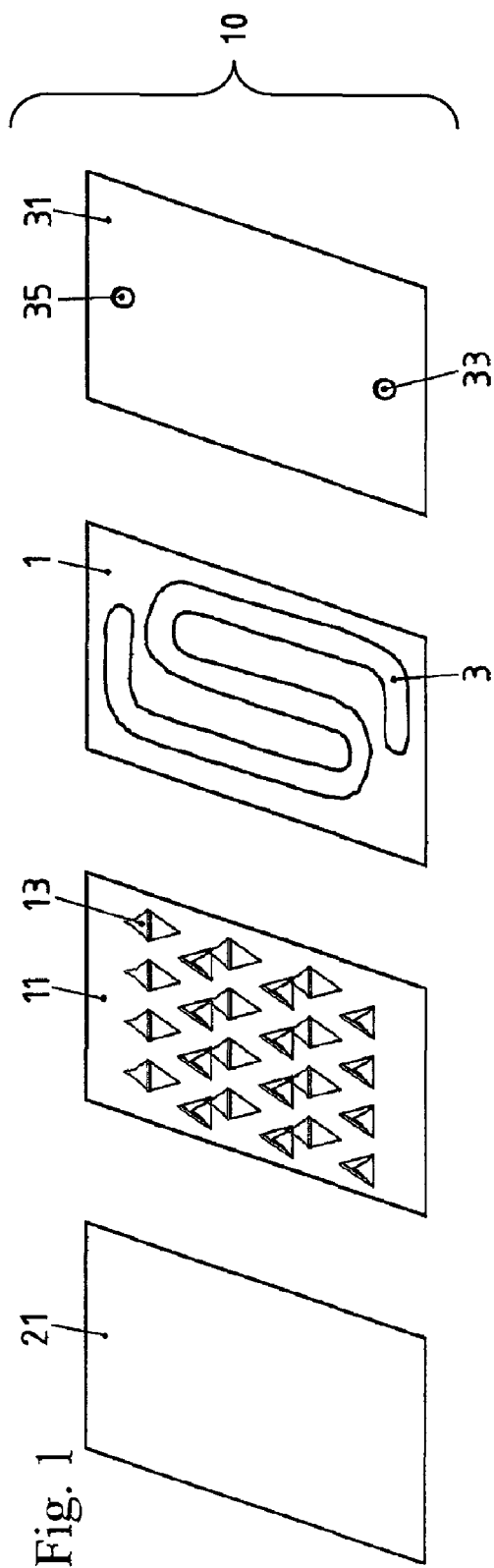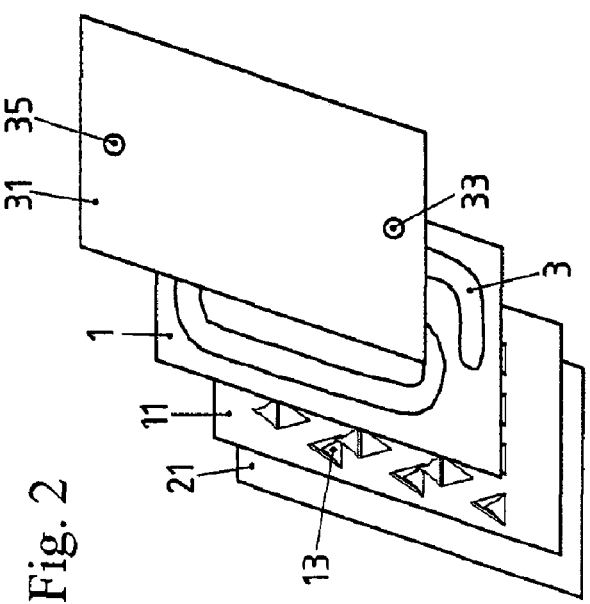

a)

b)

a)

b)

FLUIDIC DEVICE CONTAINING 3D STRUCTURES

FIELD OF THE INVENTION

The present invention refers generally to micro fluidic devices, and in particular to a 3D micro fluidic device comprising a laminate structure, and to a process for the production of such a 3D micro fluidic device.

BACKGROUND OF THE INVENTION

Multilayer micro fluidic devices comprising at least one layer with fluidic paths or channels or fluidic structures that achieve two-dimensional (2D) hydrodynamic focusing (in plane directions) are known. These multilayer devices, or the individual layers, are produced by means of known techniques such as, for example, etching, injection moulding, punching, and cutting.

For example, WO 01/25137 discloses the production of modular 3-dimensional (3D) micro fluidic devices using a plurality of layers, most of which are produced and processed by etching processes known e.g. from photolithography. Within the disclosed devices fluidic channels are arranged in a plurality of layers, the channels being interconnected between the various layers thus creating a 3D fluidic network.

WO 99/19717 and U.S. Pat. No. 6,827,906 both disclose the production of 3D micro fluidic devices containing microstructure arrays. The transport of fluids through micro channels is achieved by means of electro osmotic flow or by means of electrophoresis. The micro fluidic devices are multilayer arrays, each layer being formed by a laminate continuously drawn from a roll and passed trough a process step for producing openings, reservoirs, flow channels, and the like.

Further, EP 1 542 010 describes an analytical chip unit comprising various layers, through which a flow channel is extending. Through the flow channel, whose section is in closed shape, a fluid sample is made to flow for carrying out analyses regarding the fluid sample based on interaction between a predetermined substance and a specific substance, which is placed facing said flow channel. The chip further has a projection member attached to said flow channel. It is concluded that with the arrangement according to EP 1 542 010 it becomes possible to analyse the fluid sample efficiently with high precision.

The disadvantage of known 3D microstructures and the processes for producing these 3D microstructures is that they can only by obtained by using various layers of 2D substrates or by complex processes such as several etching processes. In other words, the production costs for the known 3D microstructures are quite substantial.

SUMMARY OF THE INVENTION

It is against the above background that the present invention provides 3D micro fluidic structures having a simple architecture. The present invention further provides a method of producing 3D micro structures for micro fluidic devices by means of which 3D structures can be obtained with reduced costs.

In a first aspect, the present invention concerns a process for producing a micro fluidic device. In one embodiment, the method for producing a micro fluidic device comprises forming a structured pattern in a first substrate layer comprising an anisotropic material, the structured pattern being in a plane with a surface of the first substrate layer; and forcing the structured pattern out of the plane with the surface to form a 3-dimensional (3D) micro structure with the first substrate layer, the 3D micro structure being configured to influence flow of a fluid flowing through the micro fluidic device.

In a second aspect, the invention concerns a micro fluidic device. The micro fluidic device comprises a laminate structure comprising a plurality of individual layers of which a first layer comprises a micro fluidic channel structure, and a second layer comprising a 3D micro structure configured to influence a flow characteristic of a fluid within the micro fluidic channel structure is provided adjacent the first layer, the 3D structure being formed from a structured pattern of an anisotropic material.

These and other features and advantages of the present invention will be more fully understood from the following description of various embodiments of the present invention taken together with the accompanying drawings.

BRIEF DESCRIPTION OF THE DRAWINGS

The following detailed description of the embodiments of the present invention can be best understood when read in conjunction with the following drawings, where like structure is indicated with like reference numerals and in which:

FIG. 1 is an exploded view of an embodiment of an micro fluidic device comprising four layers, FIG. 2 shows schematically a manner of combining the four layers of FIG. 1 for producing the micro fluidic device.

Figure 3:
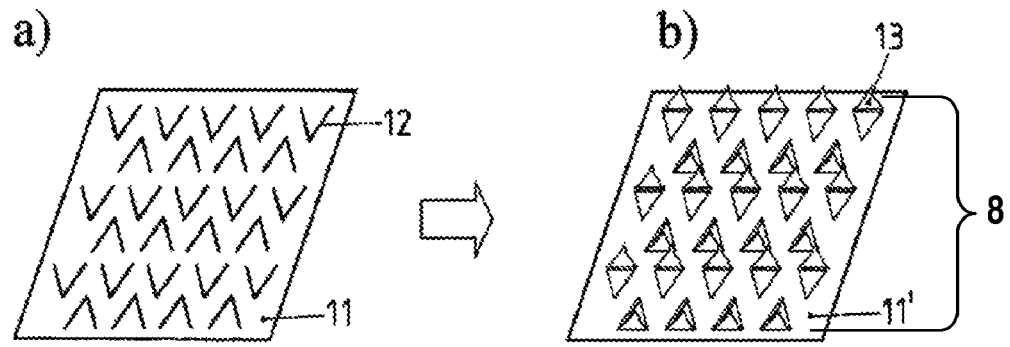
FIG. 3 shows schematically an embodiment of a 3D micro structure layer producible by deformation.
Figure 4:
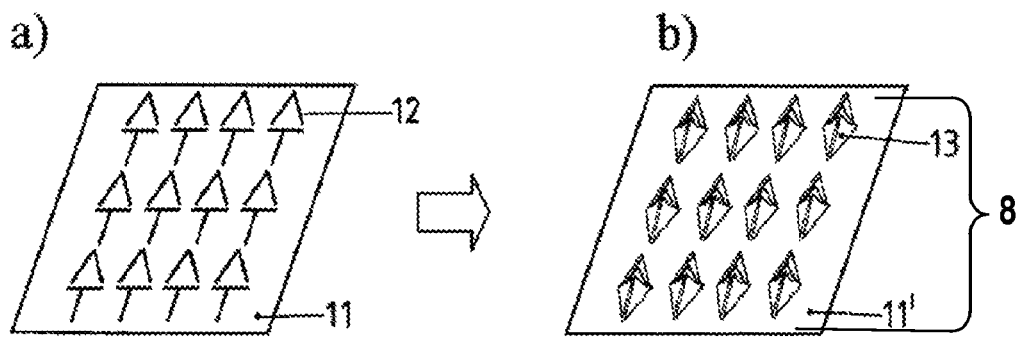
FIG. 4 shows a further embodiment of a 3D micro structure layer producible by deformation.
Figure 5:
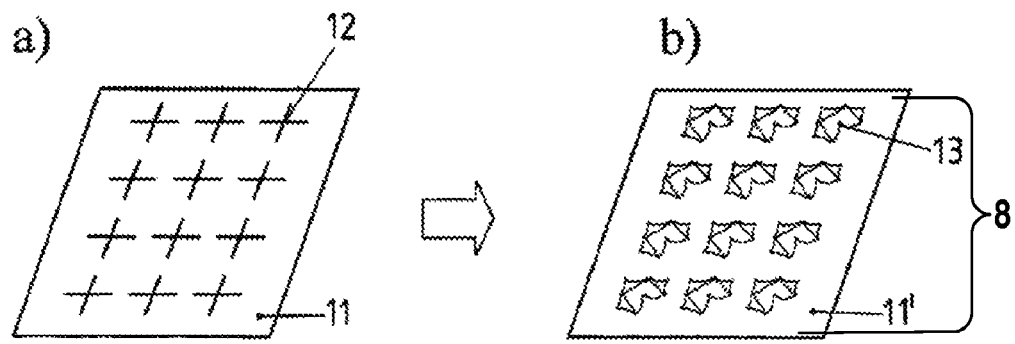
FIG. 5 shows a still further embodiment of a 3D micro structure layer producible by deformation, FIG. 6 again shows yet another embodiment of a 3D micro structure layer producible by deformation, FIG. 7 again shows a further embodiment of a 3D micro structure layer producible by deformation.
Figure 6:
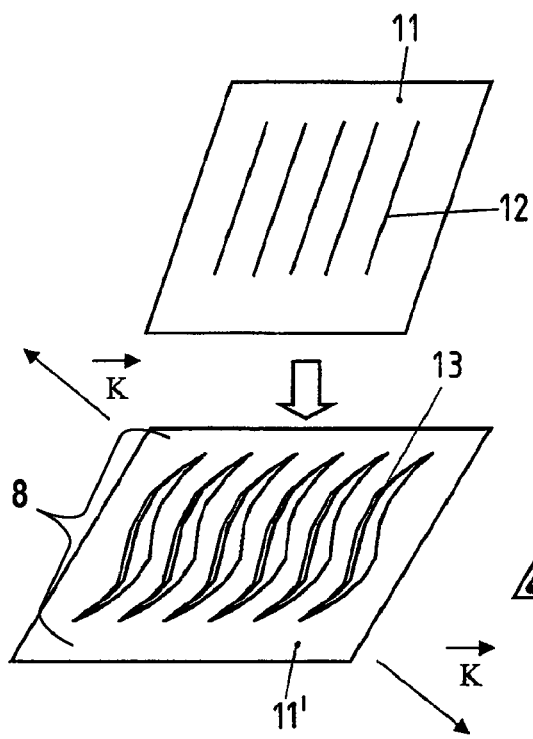
Figure 7:
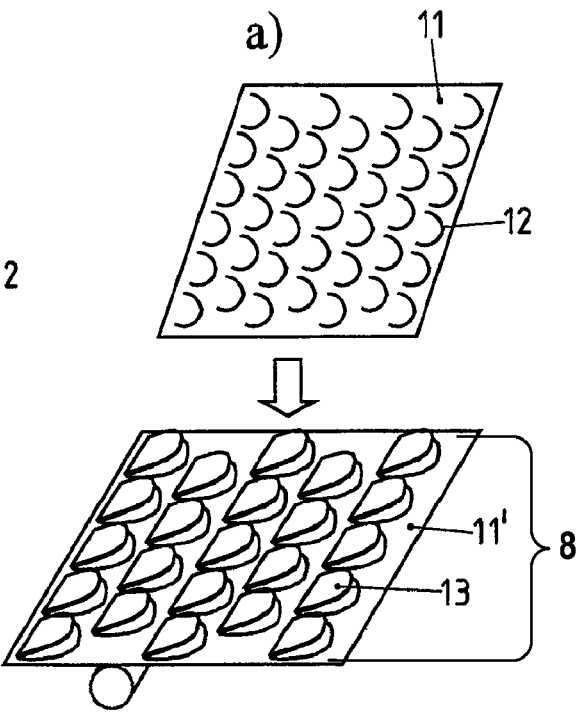
Figure 8:
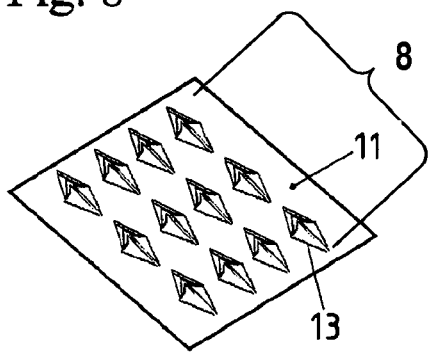
FIG. 8 shows another embodiment of a 3D micro structure layer.

Skilled artisans appreciate that elements in the figures are illustrated for simplicity and clarity and have not necessarily been drawn to scale. For example, the dimensions of some of the elements in the figures may be exaggerated relative to other elements to help improve understanding of the embodiment(s) of the present invention.

DETAILED DESCRIPTION OF THE INVENTION

Below and with reference to the following schematic drawings a brief description of examples of devices and processes according to the present invention are disclosed.

FIG. 1 shows schematically an illustrative embodiment of a construction of a micro fluidic device in exploded view and generally indicated by reference symbol 10. The micro fluidic device 10 comprises at least four different layers such as a first substrate layer 1 comprising a micro fluidic channel structure 3 along which e.g. a fluid flows, such as a fluid sample to be treated in a predetermined manner trough various sections, compartments, reservoirs, and the likes. Next to the first substrate layer 1 with the micro fluidic channel structure 3, a second substrate layer 11 is shown comprising a 3D micro structure which is generally indicated by reference symbol 8 and formed from extending or projecting parts 13 unflattened or erected out of plane from a surface 9 of the second substrate layer 11. These individual out of plane projecting parts 13 of the 3D micro structure 8 are designed to influence the flow characteristics of a fluid, such as a fluid sample, moving through the micro fluidic channel structure 3 within the first substrate layer 1 to guarantee e.g. appropriate mixing of the fluid sample while flowing through the channel structure 3, dissolving of solid components within the fluid, influencing the flow resistance, and the likes.

As further shown, on non-facing sides of the two substrate layers 1 and 11 a top layer 31 and a base layer 21 are provided, respectively, to finish the micro fluidic device 10. Within the top layer 31 an inlet opening 33 and an outlet opening 35 are provided for the introduction of the fluid sample and for collecting the finally treated, reacted and/or analyzed test sample, respectively.

In FIG. 2 it is schematically shown how the four layers 1, 11, 21 and 31 can be combined e.g. by laminating the individual layers.

In one embodiment, the 3D micro structure 8 is produced first independently out of a suitable planar or 2D substrate such as e.g. a film, foil, or sheet comprising a material(s) selected from metals, polymers, fibers, composites, etc., and combinations thereof, according the inventive method and afterwards combined with the other layers to form the mentioned micro fluidic device 10. In another embodiment, the 3D micro structure 8 is produced in correspondence with the design of the micro fluidic channel 3.

With reference to the further figures, methods for structuring and forming the substrate to produce the 3D micro structure 8 shall be described in detail. Common to all methods is that first substrate layer 11 is structured by using a suitable method to create the basic form or structured pattern 12 of the projecting parts 13 in their pre-erected or flattened state.

Afterwards, according to one embodiment, the first substrate layer 11 is formed so that the flattened, structured pattern 12 of the projecting parts 13 are forced out of plane with the surface 9 of the first substrate layer 11 to achieve the erected 3D micro structure 8. For patterning or structuring the structured pattern 12 in the first substrate layer 11, various known methods are suitable such as e.g. etching, laser cutting, conventional cutting, punching, micro structured cutting by using a cutting role, and the likes. The forcing or deformation of the extending part 13 out of plane with the surface 9 of the first substrate layer 11 after providing the structured pattern 12 can be done either mechanically or thermally or by using other suitable methods.

Basically, in one embodiment a planar substrate is used for the first substrate layer 11, which in one embodiment has anisotropic, direction dependent properties. As used herein, the term "anisotropic, direction dependent properties," means properties responsible for creating a direction force which in one embodiment is perpendicular to the surface 9 of the first substrate layer 11 for the out of plane deformation of the created structured pattern 12. In one embodiment, the anisotropy within the first substrate layer 11 is such that by applying a respective force to the structured pattern 12, the projecting parts 13 are forced to erect on the same side of the first substrate layer 11. In other embodiments, the anisotropy within the first substrate layer 11 may be such that a portion of the projecting parts 13 erect from the structured pattern 12 on different sides of the first substrate layer 11, if desired.

For example, in one embodiment, the first substrate layer 11 can have on opposite side materials of different modules of elasticity, bending strength, or thermic elongation coefficients to provide the desired the anisotropy within the first substrate layer 11. In one embodiment, the materials can be separate material layers, surface coatings, and combinations thereof. In still other embodiments, the substrate material has other differing physical properties on both sides such as e.g. different thermic conductivity of the substrate which can lead to different thermic forming response of each side of the first substrate layer 11 to applied heat to provide the desired anisotropy within the first substrate layer 11. In still other embodiments, the use on opposite sides of the first substrate layer 11 of materials with different electric conductivity properties can be provided, so that by applying a current different heating is achieved on both sides of the first substrate layer 11 which can also lead to different thermal forming, thereby providing the desired anisotropy within the first substrate layer 11.

In one embodiment, a possible deformation technique is mechanical forming, which is shown with respect to the following FIGS. 3 to 7. FIG. 3a shows the first substrate layer 11, in which respective structured patterns 12 are created by a suitable method e.g. cutting. By applying a deformation force the structured patterns 12 are forced out of a surface plane, indicated by reference symbol 11', of the first substrate layer 11 for creating extending parts 13 as shown in FIG. 3b. The deformation can be achieved e.g. by a simple bending movement of the first substrate layer 11, such as for example, by forcing the first substrate layer 11 over a roll or an edge, or by applying a distortion force, and the likes. It is to be appreciated that the 3D micro structure 8 comprising the projecting parts 13 in one embodiment is flattenable in the plane 11' with a surface of substrate 11 but due to the physical properties of the substrate 11 and the subsequent response of the substrate 11 to the forcing, the projecting parts 13 will remain normally erected out of the surface plane 11' thereafter.

In a similar manner again by a mechanical deformation the 3D micro structures 8 comprising projecting parts 13 as shown in FIG. 4b and FIG. 5b can be achieved starting from the respective flattened structured pattern 12 as shown in FIGS. 4a and 5a.

Again a mechanical deformation is responsible to achieve the 3D micro structures 8 comprising projecting parts 13 as shown in FIGS. 6b and 7b, where instead of a bending, torsion, or distortion force an expansion force can be applied according the two arrows $\vec{K}$ as shown in FIG. 6b. The basis for the 3D micro structure 8 again is a plane 2D substrate, such as the first substrate layer 11, within which respective patterned structures 12 are created, as shown in FIGS. 6a and 7a. But of course in another embodiment, instead of an elongation force again a bending force could be applied which especially is possible for producing the 3D structure according FIG. 7b.

In still other embodiments, such as for example as shown in perspective view, a 3D micro structure 8 is created by providing projecting parts 13 on the first substrate layer 11.

Figure 9:
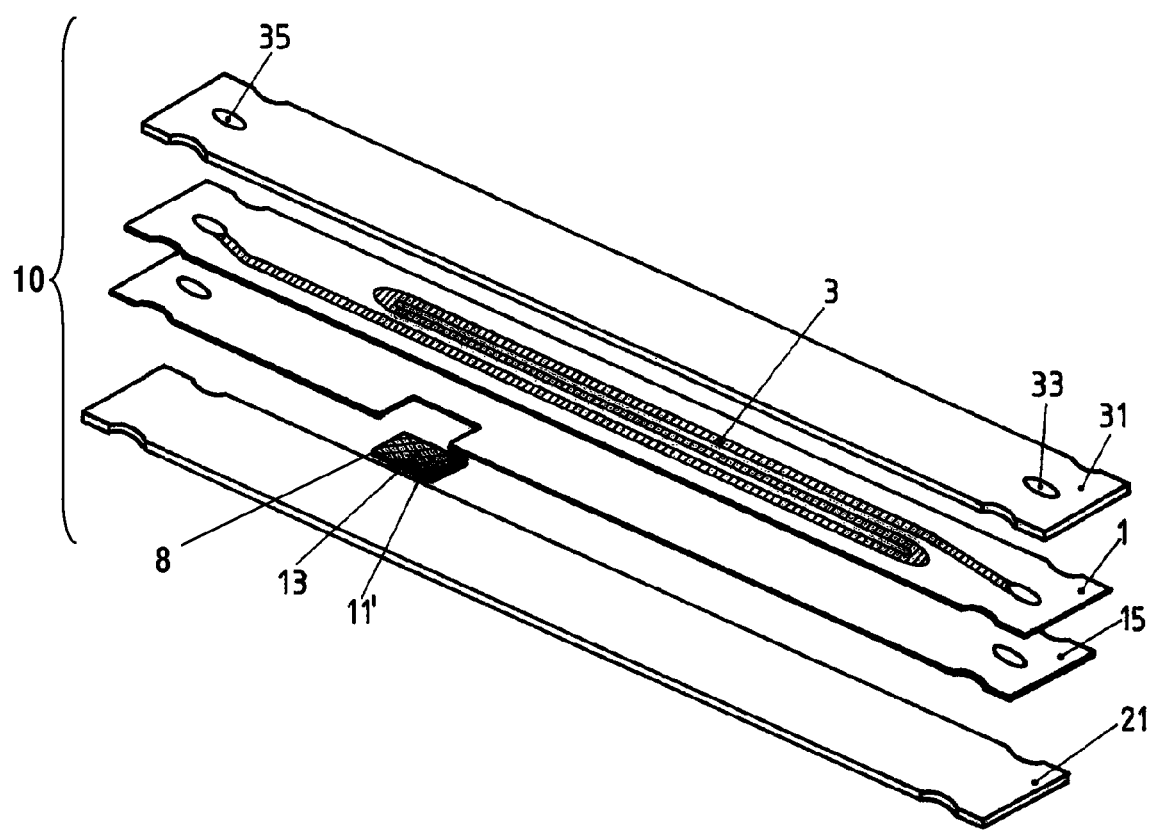
FIG. 9 shows an embodiment of an assembly of an micro fluidic device which includes the 3D micro structure layer of FIG. 8.

FIG. 9 shows an another illustrative embodiment of an assembly of a micro fluidic device 10 corresponding to the devices as shown in FIGS. 1 and 2. The micro fluidic device 10 in this embodiment includes the second substrate layer 1, within which a pattern of the micro fluidic channel structure 3 is arranged. The micro fluidic channel structure 3 consist of various channels, reservoirs, mixing areas, and the likes. To influence the flow of a sample flows along the path of the channel structure 3 a further layer 15 arranged with the first substrate layer 11 comprising the 3D micro structure 8 is provided. Finally the micro fluidic device 10 according FIG. 9 comprises a base layer 21 and a top layer 31, the latter comprising inlet and outlet openings 33 and 35, respectively. In other embodiments, instead of only one first substrate layer 11 comprising the 3D micro structure 8, further first substrate layers 11 comprising the same or different patterns for the 3D micro structure 8 could be arranged on the further layer 15 to influence the flow of the fluid sample along the path of the channel structure 3.

Figure 10:
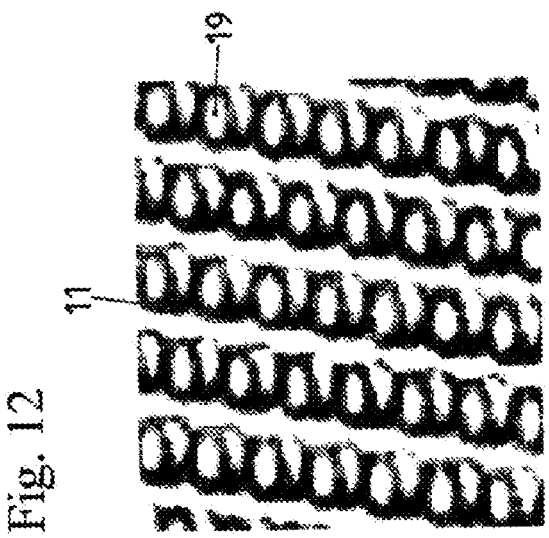
FIG. 10 shows a further embodiment of a 3D micro structure layer, FIG. 11 again shows a further embodiment of a 3D micro structure layer.
Figure 11:
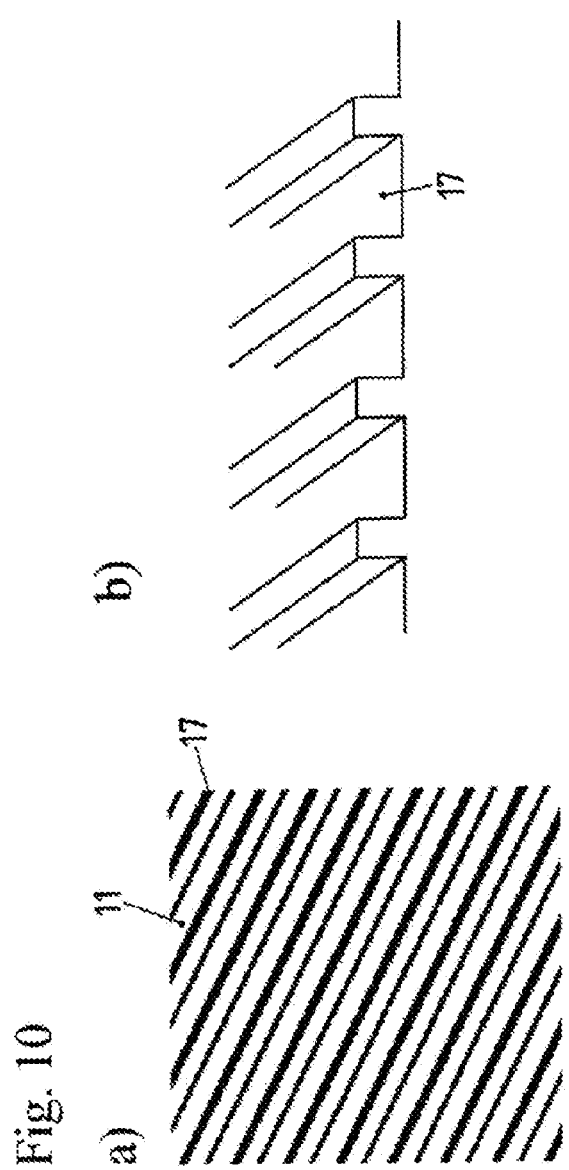

In still other embodiments, instead of mechanically or thermally working the first substrate layer 11 to achieve the 3D micro structure 8, it is also possible to produce such 3D micro structures by treating or processing one side of the first substrate layer 11 by means of special tools as e.g. shaping tools to get a shaped structure 17 and 18 as shown schematically in FIGS. 10 and 11. In FIG. 10 crosswise grooves 17 are shown and in FIG. 11 broken transverse grooves 18. The distance between the grooves maybe e.g. 10-100 µm and the depths of the grooves may be e.g. 30 µm. Typically, the angle of the grooves in FIG. 11 may be e.g. 45°.

Figure 12:
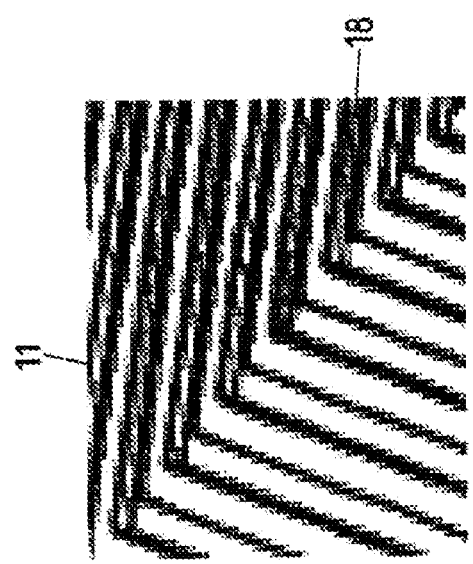
FIG. 12 shows a further embodiment of a 3D micro structure layer.

In another embodiment, instead of grooves it is also possible to have so called pillar arrays 19 as schematically shown in FIG. 12. Those pillar arrays maybe produced e.g. by etching according the process as used in photolithography. The distance between the individual pillars 19 may be e.g. 200 µm, the diameter of the pillars may be e.g. 100 µm, and the altitude of each individual pillar may be e.g. 50 µm.

The shown 3D micro structures with reference to the FIG. 1 till 12 are generally used for micro fluidic devices. The 3D micro structures are in one embodiment used in devices with a layered architecture which means devices with various layers. As described with reference to FIGS. 1, 2 and 9, these devices are comprising a basis as bottom or base layer, a top layer, one or more layers with micro fluidic paths and one or more layers with the inventively described 3D micro structure.

The devices of the invention can in various embodiments be used as follows.

Mixing structures, e.g., so called herring bones, for homogenising a sample liquid with one or more solvents and/or reagents or for mixing two or more components or for forcing a specific flow rate of the sample liquid or for changing the flow resistance with in the channels.

Dissolving structures which are structures which can cause a mass transfer in a perpendicular direction in respect to the flow direction of the sample liquid so that it can be achieved, that a e.g. dried up component sticking to the channel bottom of the micro fluidic channel can be homogeneously distributed over the whole channel square section. Furthermore by using the 3D micro structure it can be achieved in general that a solid component within the fluid channels can be better dissolved by a liquid sample or a dried component within the channel can be wetted and again be dissolved by using a solvent.

Another effect of using the 3D micro structures is to influence the flow rate, the flow velocity or the flow resistance, respectively of fluid moving in a channel and to achieve a specific flowing profile within the micro fluidic channel.

E.g. dried up components within the middle of a channel structure can be dissolved by using 3D micro structures without the danger, that influenced by capillary forces the components will be accumulated at the walls of the channel structure. Once accumulated components can only be extracted with difficulty from walls, as there the flow velocity is reduced due to a parabolic flow profile.

Dissolving structures as e.g. a pillar array as shown in FIG. 12 can promote the dissolving of a dried up component within a channel, as the dried up component is not dried in the form of a compact volume. Due to the 3D micro structure as the pillar array the dissolving area with the dried up component offers a plurality of contacting points for the solvent and, therefore, the dried up component can be faster dissolved as in case, that there is no structure.

Figure 13:
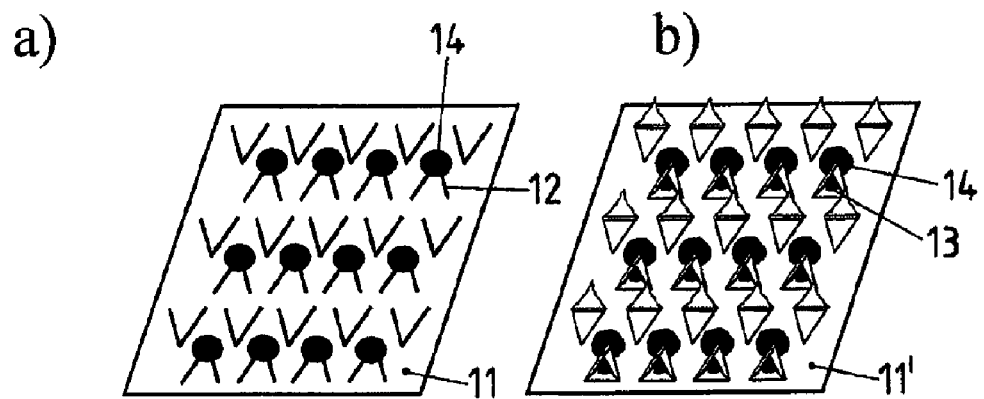
FIG. 13a shows an embodiment of a planar substrate layer planned as 3D micro structure layer comprising a pre-structured substrate, with spots of e.g. detection chemistry.
FIG. 13b shows the 3D micro structure layer of FIG. 13a after forming.

A further application is a micro optic application by creating a so called micro mirror array to achieve confocal-optical detection within a micro fluidic channel. In that respect we refer to FIGS. 13a and 13b where another specific 3D micro structure is schematically shown. In FIG. 13a on a first substrate layer 11 a triangle like structured pattern 12 is shown comprising at the peak of each triangle a detection spot 14. By applying a bending or torsion force the individual triangles 12 are forced out of the surface plane 11' to create upwards bended triangle like projecting parts 13 comprising at each peak the detection spot 14. By applying a special illumination procedure, e.g. a light beam in a specific angle to the projecting parts 13 the light maybe reflected from the detection spots 14, so that the background signal of parts which are not bent gets reduced. An other way to reduce the background signal of the parts which are not bent is to focus with the detection optics on the bended portions only in a confocal way meaning that all the light out of the focus gets masked out.

By positioning each of the detection spots 14 such as only a part of the spotted area covers the bended portion, the active spot size (the part of the spot on the bended position) can be reduced in comparison to the total spotted area. This allows to create small active spots without the need to reduce the total size of the spotted area.

The fluid sample to be analyzed in the present invention can be e.g. a prepared human or animal body fluid such as e.g. blood.

Figure 14:
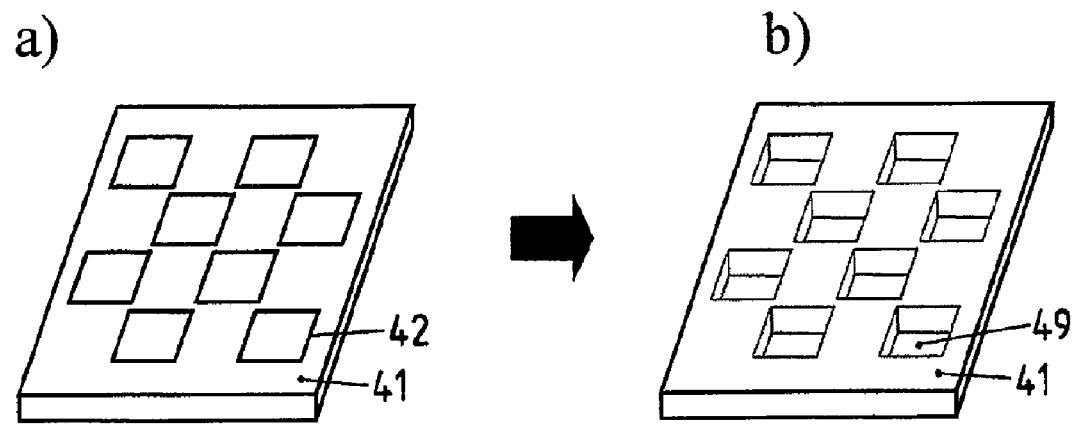
FIG. 14 shows a further embodiment of producing a 3D micro structure by cutting a substrate layer with an increased thickness.
Figure 15:
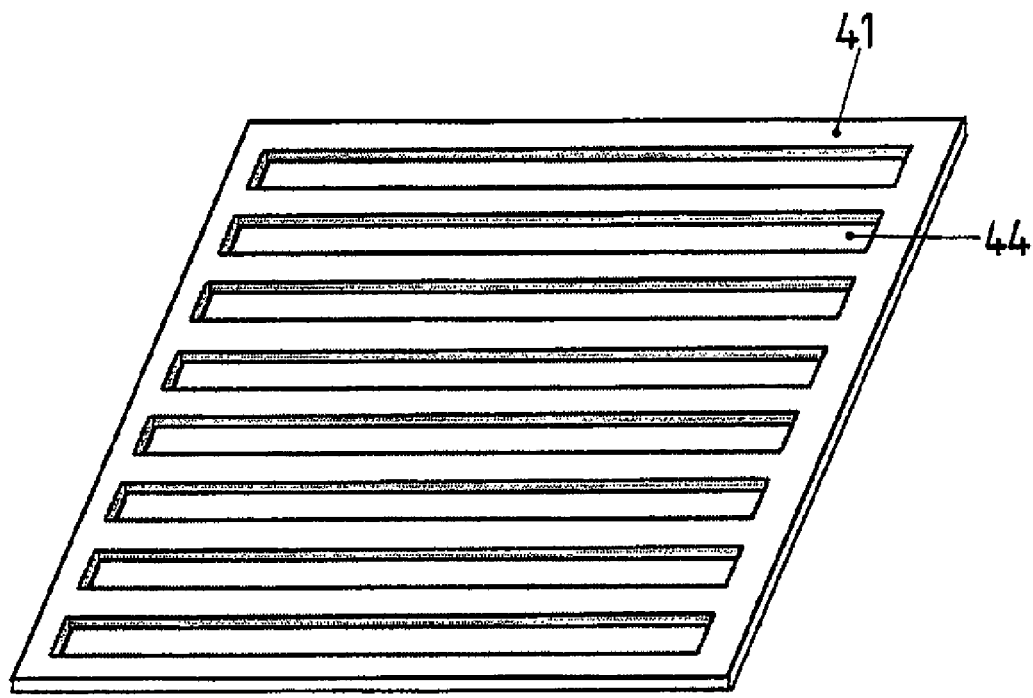
FIG. 15 shows a further embodiment of a 3D micro structure based upon a substrate layer with an enlarged thickness.
Figure 16:
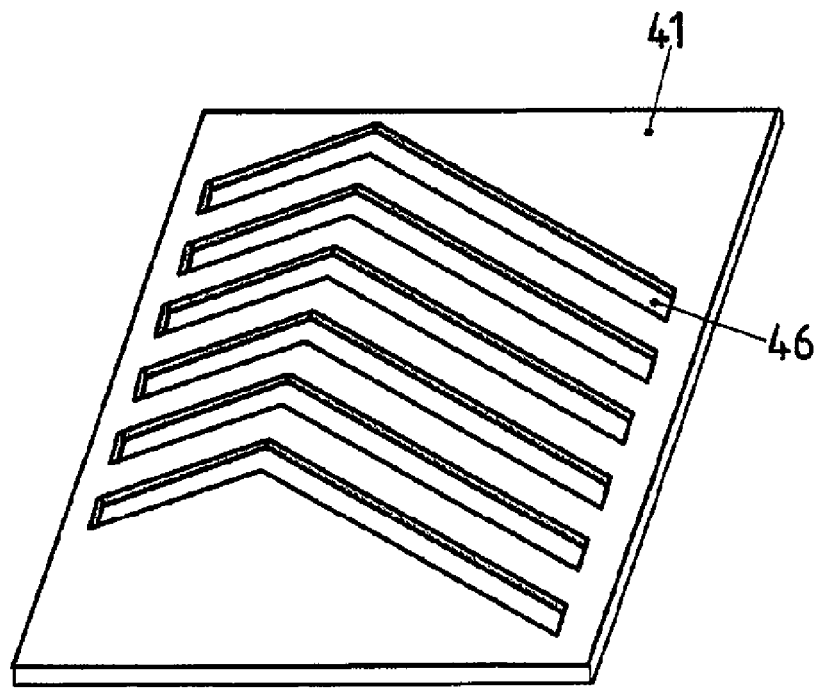
FIG. 16 shows again a further embodiment of a 3D micro structure based upon a substrate layer with an enlarged thickness.

A further possibility to create a 3D micro structure is by using a first substrate layer 11 having a layer thickness which is in one embodiment relatively larger than the thickness of e.g. the second substrate layer 1 comprising the micro fluidic channel structure 3. Respective examples of layers with an enlarged relative thickness are shown in FIGS. 14 to 16. Within a substrate 41 with an enlarged thickness, structured patterns 42 are created, e.g. by using a cutting knife, which are shown in FIG. 14a. By punching out the created structured patterns 42, holes 49 within the substrate layer 41 are created as shown schematically in FIG. 14b. In a similar manner, micro structured 3D patterns 44 and 46 are created as shown schematically in FIGS. 15 and 16. Again the substrates as shown in FIGS. 14 to 16 can be combined with layers containing micro fluidic channels to produce micro fluidic devices similar to those described in FIGS. 1, 2 and 9. It goes without saying that the structures as shown in FIGS. 14-16 can influence the flow of a liquid sample within a channel or path within a micro fluidic layer being placed next to the 3D structure e.g. on top of the 3D structure.

A great advantage of the present invention is that the 3D micro structures of a micro fluidic device have not to be aligned in a very precise and exact manner in relation to the channel containing layer. A 3D micro structure can be produced independently from channel containing structure. The two structures can then later be put together with an overlap of the two layers. This reduces the requirements for the alignment of the two layers during the assembly of the complete microfluidic device.

FIGS. 1 to 16 only show and describe examples of 3D micro structures and of micro fluidic devices using an inventive 3D micro structure, and other designs and other combinations to produce micro fluidic devices are possible. Important is, that the 3D micro structure is produced within an individual layer and combined with other layers to a micro fluidic device. With other words, there is no need to build up various layers on one substrate e.g. using a plurality of etching steps as known e.g. in photolithography technique. Furthermore, not a plurality of layers have to be used to achieve the 3D structure, but the 3D structure is achieved by using one layer followed e.g. by a mechanical or thermal process as described above. Instead of a mechanical, thermal or chemical treatment it is also possible to use a substrate layer with an enlarged thickness to achieve the 3D structure.

By using the inventive method and the inventive 3D structures it is possible to achieve in a simple manner 3D multifunctional micro structures without the need to build up various layers by using masks as known within the state of the art. By using the 3D micro structures according to the present invention, lower production costs are possible for the production of micro fluidic devices. Furthermore according the demands of flow, flow rate, micro fluidic function, use of various fluid samples, use of dry components, chemical reactions, etc., the 3D micro structures can be individually adapted in relation to the micro fluidic channels or the function of the structures.

The invention claimed is:

1. A method for producing a micro fluidic device, the method comprising:

forming a pre-erected or flattened structured pattern in a surface plane of a first substrate layer, said first substrate layer comprising an anisotropic material, said structured pattern being physically formed in a plane with a surface of said first substrate layer; and subsequently forcing said pre-erected or flattened structured pattern to project out of said surface plane to form a 3-dimensional (3D) micro structure erected out of said surface plane, said 3D micro structure being configured to influence flow of a fluid flowing through said micro fluidic device.

2. The method according to claim 1 wherein said forming is by a process selected from etching, punching, cutting, laser cutting, and roll cutting.

3. The method according to claim 1 wherein said forcing is by a process selected from mechanical working and thermal forming.

4. The method according to claim 1, wherein said forcing is via bending said first substrate layer.

5. The method according to claim 1, wherein said forcing is via applying a force selected from bending, torsion, and expansion.

6. The method according to claim 1 further comprising providing a second substrate layer comprising a micro fluidic channel structure adjacent said first substrate layer such that said 3D micro structure influences flow of a fluid flowing through said micro fluidic channel structure.

7. The method according to claim 1, further comprising providing a base layer, a second substrate layer comprising a micro fluidic channel structure adjacent said first substrate layer such that said 3D micro structure influences flow of a fluid flowing through said micro fluidic channel structure, and a top layer, wherein at least one of said base layer and said top layer comprises an inlet opening and an outlet opening, said openings being in fluidic communication with said micro fluidic channel structure.

8. The method according to claim 1, wherein said first substrate layer comprises on opposite sides different material properties such that said 3D micro structure is forced out of the surface plane of the first substrate layer by differing responses of said opposite sides to said forcing.

* * * * *

UNITED STATES PATENT AND TRADEMARK OFFICE
CERTIFICATE OF CORRECTION

| | | |
|---|---|---|
| PATENT NO. | : 7,977,122 B2 | |
| APPLICATION NO. | : 11/669351 | |
| DATED | : July 12, 2011 | |
| INVENTOR(S) | : Roger Sandoz et al. | |

It is certified that error appears in the above-identified patent and that said Letters Patent is hereby corrected as shown below:

Col. 1, Line 33, "and passed trough a process" should read --and passed through a process--
Col. 2, Line 25, "embodiment of an micro" should read --embodiment of a micro--
Col. 2, Line 41, "assembly of an micro" should read --assembly of a micro--
Col. 3, Line 15, "manner trough various" should read --manner through various--
Col. 3, Line 44, "according the" should read --according to the--
Col. 4, Line 19, "the desired the anisotropy" should read --the desired anisotropy--
Col. 4, Line 62, "according the two arrows" should read --according to the two arrows--
Col. 5, Line 2, "according FIG. 7b" should read --according to FIG. 7b--
Col. 5, Line 6, "shows an another illustrative" should read --shows another illustrative--
Col. 5, Line 11, "structure 3 consist of" should read --structure 3 consists of--
Col. 5, Line 14, "of a sample flows along" should read --of a sample flowing along--
Col. 5, Line 16, "according FIG." should read --according to FIG.--
Col. 5, Line 34, "grooves maybe e.g." should read --grooves may be e.g.--
Col. 5, Line 39, "pillar arrays maybe produced" should read --pillar arrays may be produced--
Col. 5, Line 40, "according the process" should read --according to the process--
Col. 5, Line 59, "resistance with in the channels" should read --resistance within the channels--
Col. 6, Line 35, "the light maybe reflected" should read --the light may be reflected--
Col. 6, Line 37, "An other way" should read --Another way--
Col. 6, Line 41, "such as only" should read --such that only--
Col. 6, Lines 44-45, "This allows to create" should read --This allows creation of--
Col. 7, Lines 15-16, "Important is, that" should read --It is important that--
Col. 7, Line 18, "With other words," should read --In other words,--
Col. 7, Line 33, "Furthermore according the" should read --Furthermore according to the--

Signed and Sealed this
Eighteenth Day of October, 2011

David J. Kappos
*Director of the United States Patent and Trademark Office*